United States Patent [19]

Chan et al.

[11] Patent Number: 4,486,670
[45] Date of Patent: Dec. 4, 1984

[54] MONOLITHIC CMOS LOW POWER DIGITAL LEVEL SHIFTER

[75] Inventors: Yiu-Fai Chan, Saratoga, Calif.; Allen L. Evans, Colorado Springs, Colo.

[73] Assignee: Intersil, Inc., Cupertino, Calif.

[21] Appl. No.: 340,765

[22] Filed: Jan. 19, 1982

[51] Int. Cl.³ .................... H03K 17/60; H03K 17/04
[52] U.S. Cl. ............................. 307/264; 307/247 R; 307/279
[58] Field of Search ........... 307/264, 448, 451, 247 R, 307/279

[56] References Cited

U.S. PATENT DOCUMENTS

| | | | |
|---|---|---|---|
| 3,801,831 | 4/1974 | Dame | 307/264 |
| 4,029,973 | 6/1977 | Kobayashi et al. | 307/247 R |
| 4,039,862 | 8/1977 | Dingwall et al. | 307/247 R |
| 4,161,663 | 7/1979 | Martinez | 307/264 |
| 4,216,390 | 8/1980 | Stewart | 307/279 |

*Primary Examiner*—John S. Heyman
*Assistant Examiner*—Timothy P. Callahan
*Attorney, Agent, or Firm*—Spensley Horn Jubas & Lubitz

[57] ABSTRACT

A CMOS digital level shifter circuit is provided which latches one transistor of a complementary transistor pair off when the other transistor of the pair is on to prevent direct current dissipation of power when the input signals to the shifter circuit are not in transition.

8 Claims, 3 Drawing Figures

MONOLITHIC CMOS LOW POWER DIGITAL LEVEL SHIFTER

BACKGROUND OF THE INVENTION

1. Field of the Invention

The present invention relates to digital level shifters and more particularly, to CMOS low power level shifters.

2. Description of the Prior Art

Integrated circuits such as EPROMs, or erasable programmable read-only memories, are often fabricated using complementary metal-oxide semiconductor (CMOS) technology, since very low power dissipation can be achieved. Other fabrication techniques, such as p-channel MOS (PMOS), n-channel MOS (NMOS) or bipolar technologies, can consume orders of magnitude more power than comparable CMOS devices.

In an EPROM device, a relatively high voltage (on the order of 20 volts) is generally necessary to inject electrons into the floating gate in order to program the device. However, most logic functions are conducted at much lower voltages, typically 5 volts. Thus, a digital level shifter is necessary to shift the 5 volt voltage level (which may correspond to a logical HIGH or "1") to a higher voltage level such as 20 volts, in order to program the EPROM.

A typical prior art digital level shifter is shown in FIG. 1. The circuit includes a complementary pair of transistors, one n-channel and one p-channel, which inverts a digital input signal. The inverted signal is then reinverted by a second complementary transistor pair. The second transistor pair is typically connected to a larger supply voltage in order to provide the increased voltage output. This configuration has the disadvantage that if the state of the signal at the input of the second complementary transistor pair is such that the n-channel transistor is turned on, the p-channel transistor is usually turned on also, as a consequence of typical p-channel transistor threshold voltages. With both transistors of the pair turned on, a current path from the voltage supply to ground is present, resulting in undesirable power consumption.

One of the basic criteria for minimizing the power consumed by a device is that there be no direct current path from the voltage supply to ground when the input signals are not in transition. Because of the characteristics of prior art level shifters, however, power can be dissipated through the second complementary transistor pair even though the input signals remain constant.

SUMMARY OF THE INVENTION

It is an object of the present invention to provide a digital level shifter to allow circuits with large differences in supply voltages to be integrated using CMOS technology while retaining practically zero direct current power consumption.

A preferred embodiment of the present invention includes a pair of complementary transistors with a latch circuit operably coupled to at least one of the transistors. The pair of transistors is connected to a power supply having a supply voltage which is larger than the supply voltage of preceeding logic stages to allow the voltage level of the digital signals at the output of the complementary pair to be shifted to a higher value. If the logic state of a digital input signal is such that one of the transistors of the complementary pair is turned on, the latch circuit of the present invention insures that the other transistor is off after the input transition is complete. Accordingly, any direct current path between the power supply and ground is blocked such that there is practically no power consumed between input signal transitions.

DETAILED DESCRIPTION OF THE DRAWINGS

Figure 1:
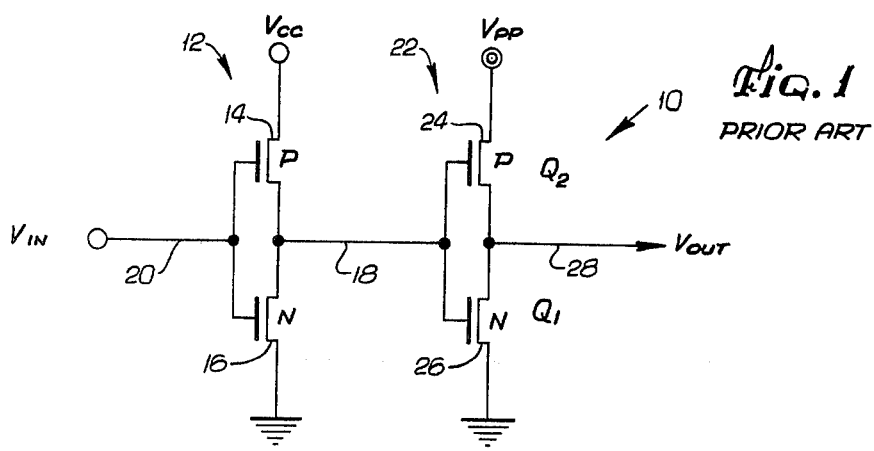
FIG. 1 is a schematic diagram of an example of a prior art digital level shifter.

FIG. 1 shows an example of a prior art digital level shifter indicated generally at 10. The shifter 10 includes a first inverter 12 which has a p-channel MOS transistor 14 and an n-channel MOS transistor 16, which form a complementary MOS or CMOS pair. The source of the p-channel transistor 14 is connected to a first supply voltage designated $V_{cc}$, with the source of the n-channel transistor 16 grounded and the drains of the transistors 14 and 16 connected to an output 18. In this example, the supply voltage $V_{cc}$ is 5 volts.

Digital input signals are provided at an input 20 which is connected to the gates of the transistors 14 and 16. If the voltage level of the digital input signal at 20 is high (typically 5 volts, corresponding to a HIGH or "1" logic state), the n-channel transistor 16 will be turned on, pulling the output 18 down to ground which corresponds to a LOW logic state, thus inverting the input signal. Where the supply voltage $V_{cc}$ and the voltage level of the HIGH logic state are both 5 volts, a HIGH input signal will also turn off the p-channel transistor 14. With the p-channel transistor 14 turned off and the n-channel transistor 16 turned on, there is no direct current path between the supply voltage $V_{cc}$ and ground and a negligible amount of power is consumed by the inverter 12. Conversely, with a logical LOW input signal (typically zero volts), the p-channel transistor 14 is turned on and the n-channel transistor 16 is turned off which pulls the output 18 approximately up to the level of the supply voltage $V_{cc}$, a logical HIGH.

In order to shift the voltage level of the digital signals at the input 20, the shifter 10 includes a second inverter 22 which has a pair of p-channel and n-channel CMOS transistors 24 and 26, respectively. The inverter 22 reinverts the inverted signals at the output 18 so that the digital output signals at the output 28 of the shifter 10 are not inverted from the logic state of the input signals at 20. The inverter 22 is coupled to a second supply voltage $V_{pp}$ which is a higher voltage level than $V_{cc}$, typically 25 volts.

A logical HIGH digital input signal at 20 is inverted to a logical LOW at output 18 which turns on the p-channel transistor 24 of the inverter 22, thereby pulling the output 28 approximately up to the level of the second supply voltage $V_{pp}$, or approximately 25 volts. In this manner, the shifter 10 shifts the level of logical HIGH digital signals from 5 volts to 25 volts.

However, if the digital input signal at 20 is a logical LOW, the signal is inverted to a logical HIGH at output 18 which turns on the n-channel transistor 26 of the inverter 22, pulling the output 28 down to ground, a logical LOW. Since the voltage level of a logical HIGH at 18 is approximately the supply voltage $V_{cc}$ (5 volts), the voltage level of the logical HIGH at 18 is insufficient to turn off the p-channel transistor 24 which is connected to a much higher supply voltage $V_{pp}$ of 25 volts. Thus, when the n-channel transistor 26 is turned on, the gate to source voltage of the p-channel transistor 24 is approximately −20 volts, which exceeds its threshold voltage. As a result, the transistor 24 remains on, providing a completed current path from the supply voltage $V_{pp}$ through the p-channel transistor 24 and n-channel transistor 26 to ground. Accordingly, excessive power is consumed in this steady state condition.

Figure 2:
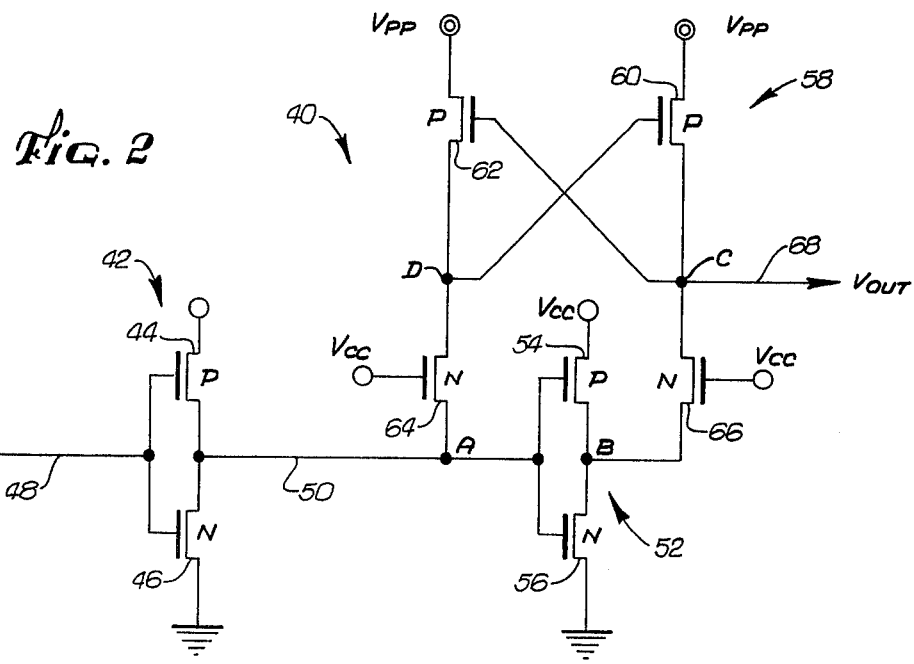
FIG. 2 is a schematic diagram of a digital level shifter circuit employing a preferred embodiment of the present invention.

Referring now to FIG. 2, a preferred embodiment of a digital level shifter circuit in accordance with the present invention is indicated generally at 40. This level shifter consumes little or no DC power under steady state conditions. The level shifter 40 may be used, for example, as an interface between lower voltage logic circuitry and erasable programmable read-only memories (EPROM's), to provide the high voltages necessary to inject electrons into the floating gates of an EPROM in order to program the device. It should be recognized, however, that the level shifter of the present invention has many applications for logic circuitry which utilize two or more power supplies of different voltage levels. Another application, for example, is in circuitry where the input logic level is less than the supply voltage of the inverter.

In the illustrated embodiment, the digital level shifter 40 is fabricated as a portion of a monolithic integrated circuit chip. The shifter 40 has an inverter 42 which includes a p-channel transistor 44 and an n-channel transistor 46 forming a CMOS transistor pair. The source of the p-channel transistor 44 is connected to a supply voltage $V_{cc}$ (again 5 volts), with the source of the n-channel transistor 46 connected to ground. The digital level shifter 40 has an input 48 connected to the gates of the CMOS transistors 44 and 46 of the inverter 42. The drains of the CMOS transistors 44 and 46 are connected to an output 50 which in turn is connected to and forms an input for the gates of another CMOS transistor pair of a second inverter 52. The CMOS transistors of the inverter 52 include a p-channel transistor 54 and an n-channel transistor 56 which are also connected to the supply voltage $V_{cc}$ and ground, respectively. The junction of the output 50 of the CMOS transistors 44 and 46 with the gates of the CMOS transistors 54 and 56 is designated node A, with the output of the transistors 54 and 56 designated node B.

In FIG. 2, for convenience, the shifter 40 has been shown to include the inverter 42. This inverter serves to complete the double inversion of the logic of the input signal at 48 to realize the same logic state at the output 68. In practice, the inverter may be contained in circuitry preceding the shifter. The inverter 42, as will be understood from the following description, does not contribute to the level shifting function.

The digital level shifter 40 further has a latch circuit 58 which shifts the voltage level of logical HIGH input signals to a higher voltage level and latches particular transistors off to eliminate power consuming current paths. The latch circuit 58 is coupled to the inverters 42 and 52 and includes a pair of cross-coupled p-channel transistors 60 and 62. The source of each of the p-channel transistors 60 and 62 is connected to a second supply voltage $V_{pp}$ which, in this example, is again approximately 25 volts. The output of the p-channel transistor 60, at the drain of the transistor 60, is connected to the gate of the cross-coupled p-channel transistor 62 at a node C. Similarly, the output of the p-channel transistor 62 is connected to the gate of the p-channel transistor 60 at a node D. The latch circuit 58 further has an n-channel isolation transistor 64 which connects the output of the inverter 42 at node A to the gate of the transistor 60 and to the output of the transistor 62 at node D. Similarly, a second n-channel isolation transistor 66 connects the output of the inverter 52 at node B to the gate of the transistor 62 and to the output of the transistor 60 at node C. The gates of the isolation transistors 64 and 66 are coupled to supply voltage $V_{cc}$. Finally, the digital level shifter 40 has an output 68 for the level shifted digital output signals at node C.

To describe the general operation of the digital level shifter 40, it may be assumed, for example, that a logical LOW digital input signal is present at the input 48 of the inverter 42. It will also be assumed that logical LOW and logical HIGH digital input signals have voltage levels of zero and 5 volts, respectively. Accordingly, a logical LOW signal at the input 48 will be inverted by the inverter 42 to a logical HIGH at node A, since p-channel transistor 44 will be turned on and the n-channel transistor 46 will be turned off, pulling node A up to the supply voltage $V_{cc}$ of 5 volts. With a logical HIGH state of 5 volts at node A, the n-channel transistor 56 of the second inverter 52 is turned on, which pulls node B down to ground which represents a logical LOW.

With the n-channel transistor 56 turned on, it is desirable that the p-channel transistors 54 and 60 (connecting the transistor 56 to the power supplies $V_{cc}$ or $V_{pp}$, respectively), are both turned off so as to avoid any direct current paths to ground. It is apparent that the p-channel transistor 54 of the inverter 52 will be turned off, since node A is at 5 volts (a logical HIGH) and the gate to source voltage $V_{GS}$ of transistor 54 is zero, since $V_{cc}$ is also 5 volts.

The operation of the circuit of FIG. 2 is such that the p-channel transistor 60 will also be turned off. With node B at a logical LOW state (zero volts), node C will also be at zero volts, since the isolation transistor 66 is turned on with the supply voltage $V_{cc}$ applied to its gate. (A logical LOW digital signal at the output 68 of the digital level shifter 40 is the desired output state with a logical LOW digital signal at the input 48.) The zero voltage at node C is fed back to the gate of the p-channel transistor 62, which turns on the transistor 62. As a result, node D is pulled up to approximately the supply voltage $V_{pp}$, i.e., 25 volts. With the gate of the transistor 60 connected to node D, the p-channel transistor 60 is turned off, since the gate to source voltage $V_{GS}$ of the transistor 60 is zero. In this manner, the transistor 62 serves as a latch, latching the p-channel transistor 60 off when the complementary n-channel transistor 56 is on. With the p-channel transistors 54 and 60 turned off, it is seen that there is no current path from the supply voltages $V_{cc}$ or $V_{pp}$ to the on n-channel transistor 56 through which power could be dissipated.

With input node A at 5 volts and the gate of isolation n-channel transistor 64 connected to the supply voltage $V_{cc}$ of 5 volts, the gate to source voltage $V_{GS}$ of transistor 64 is approximately zero volts which turns off transistor 64 to isolate node A and the inverters 42 and 52 from the high voltage at node D. This protects the off n-channel transistor 46 of the inverter 42 since 25 volts may exceed the breakdown voltage of the transistor 46. With the protection afforded by the isolation transistor 64, the n-channel transistor 46 may be fabricated to have a lower breakdown voltage. This allows the transistor 46 to be made smaller, which increases the available packing density of the digital level shifter 40 on the monolithic chip. Isolating node A from the high voltage also prevents a direct path through the p-channel transistor 44 from $V_{pp}$ to the $V_{cc}$ supply.

With a logical HIGH digital input signal at the input 48 of the digital level shifter 40, the n-channel transistor 46 of the inverter 42 is turned on and the p-channel transistor 44 is turned off, which inverts the signal at 48 to a logical LOW at node A. With node A at zero volts, the n-channel transistor 56 of the inverter 52 is turned off and the p-channel transistor 54 is turned on so that node B is pulled up to the supply voltage $V_{cc}$, or a logical HIGH state.

The logical LOW at node A is passed through the transistor 64 to node D, which turns on the p-channel transistor 60. With the p-channel transistor 60 turned on, node C and the output 68 of the digital level shifter 40 are pulled up to the supply voltage $V_{pp}$, i.e., 25 volts, shifting the 5 volt logical HIGH at the input 48 to the desired 25 volt logical HIGH at the output 68. The high voltage at the output 68 turns off the isolation transistor 66 since the gate to source voltage $V_{gs}$ is now negative. With the isolation transistor 66 turned off, the off n-channel transistor 56 is protected from breakdown by the high voltage at node C and a direct current path from $V_{pp}$ to $V_{cc}$ is also prevented. The 25 volts at node C further ensures that the p-channel transistor 62 is turned off so that there is no direct current path from the supply voltage $V_{pp}$, through the p-channel transistor 62 to the on n-channel transistors 64 and 46. Thus, the p-channel transistor 60 of the latch circuit 58 latches the p-channel transistor 62 off when the n-channel transistor 46 of the inverter 42 is turned on. Accordingly, as is the case with a logical LOW input, there is practically no power consumed with a logical HIGH input.

The digital level shifter circuit 40 may be operated in two different modes. In the first mode, the supply voltage is maintained at 25 volts as described above. In an alternative mode, the voltage level of the supply voltage $V_{pp}$ may be maintained at the same level as the supply voltage $V_{cc}$ (i.e., approximately 5 volts) while the logic state of the digital input signal is in transition. When the digital input signal has achieved a steady state, the voltage at $V_{pp}$ can be raised to the higher 25 volt level. Maintaining the voltage level of the supply voltage $V_{pp}$ at the lower voltage reduces power consumption during an input transition thus complementing the operation of the latch circuit 58, which insures that power dissipation generally occurs only during the input signal transitions.

The power consumed in the circuit 40 can be estimated by calculating the total nodal capacitance, c, the voltage transition, v, and the average frequency of voltage transitions, f. The estimated power consumption, P, is represented by the expression $P = \frac{1}{2} cv^2 f$. This power is the power used to charge and discharge internal capacitances of the circuit.

Figure 3:
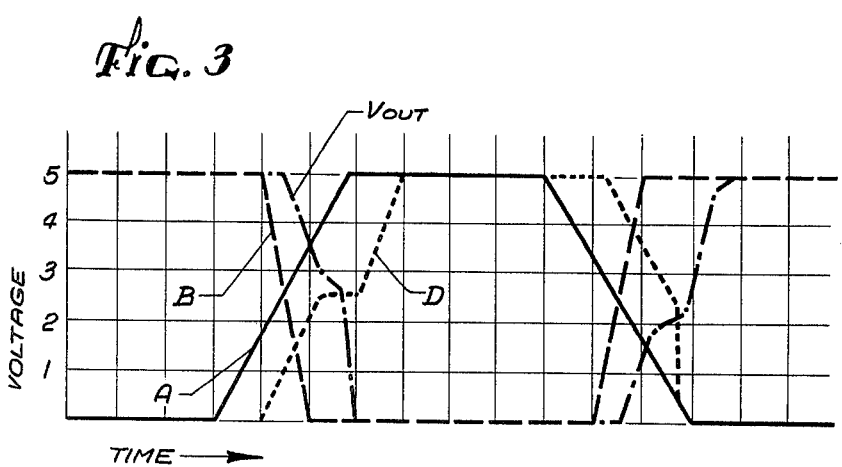
FIG. 3 is a timing diagram illustrating the voltage changes at various nodes of the circuit of FIG. 2 during input signal transitions.

FIG. 3 illustrates the change of voltage with respect to time at various nodes of the shifter circuit 40 as an input digital signal at node A changes from a logical LOW to a logical HIGH and returns to a logical LOW. The output voltage at 68 (node C) is represented by the waveform designated $V_{out}$. Here, the second supply voltage $V_{pp}$ equals $V_{cc}$ (5 volts) to clarify the relationship of the waveforms.

During a transition from one input logic state to another, one transistor of each complementary pair is in the process of turning off while the other transistor of the pair is turning on or vice versa. For example, during a transition from a HIGH input signal to a LOW input, the p-channel transistor 60 is turning off and the n-channel transistor 56 is turning on. Thus, the n-channel transistors 56 and 66 may be required to sink the current being conducted by the p-channel transistor 60. Accordingly, the n-channel transistors 56 and 66 of the preferred embodiment are designed with sufficient current carrying capacity to sink the current of the p-channel transistor 60 during such a transition so that node C will be pulled quickly to ground because of the current through the transistor 56. This will ensure that the p-channel transistor 62 is turned on so that the p-channel transistor 60 will be turned off as previously described. Similarly, the n-channel transistors 46 and 64 are designed to be able to sink the current produced by the p-channel transistor 62 during the reverse input transition to insure that node D will be pulled sufficiently low to turn on the p-channel transistor 60 and turn off the p-channel transistor 62.

In addition, in the preferred embodiment, the p-channel transistor 60 is designed to have a somewhat larger current carrying capability than the transistor 62. The p-channel transistor 60 output at 68 is provided to be connected to other devices so that the transistor 60 may be required to charge the internal capacitances of other devices. The transistor 62 on the other hand, need only charge the internal capacitances of the transistors 44, 46 and 64 and the gate capacitances of transistors 60, 54 and 56.

The gates of the isolation transistors 64 and 66 are biased at the supply voltage $V_{cc}$ so that each transistor 64 and 66 has an adequate breakdown voltage to provide the necessary isolation.

It will, of course, be understood that modifications of the present invention, in its various aspects, will be apparent to those skilled in the art, some being apparent only after study and others being merely matters of routine electronic design. For example, n-channel transistors may be substituted for p-channel transistors and vice versa. In addition, it is recognized that elements may be omitted from the preferred embodiment of FIG. 2 while maintaining the basic logical functions. For example, the isolation transistor 66 and the p-channel complementary transistor 54 may be omitted. The isolation transistor 66 is included to allow the n-channel transistor 56 to be fabricated somewhat smaller than would otherwise be necessary if the n-channel transistor 56 needed a large breakdown voltage. The p-channel transistor 54 is faster than the p-channel transistor 60 and is designed to quickly pull up the output 68 during the low voltage transition from zero to 5 volts until the latch circuit 58 latches the output and pulls it up to the full 25 volts. This allows the speed requirements of this p-channel transistor 60 to be reduced so that the current requirements are also reduced.

Thus it should be recognized that the p-channel transistor 60 of the latch circuit 58 and the n-channel transistor 56 of the inverter 52 in the illustrated embodiment form a complementary transistor pair for shifting the voltage level of digital input signals. The latch circuit 58 latches the p-channel transistor 60 off when the n-channel transistor 56 is on to prevent a direct current path to ground. Other embodiments are also possible, with their specific designs dependent upon the particular application. As such, the scope of the invention should not be limited by the particular embodiment herein described but should be defined only by the appended claims and equivalents thereof.

I claim:

1. A level shifter circuit for use with a power supply for shifting the voltage level of digital signals, said shifter comprising:
    an input for the digital signals;
    an output for shifted digital signals;
    first and second series-coupled complementary transistors with each transistor having an input coupled to the signal input and an output coupled to the signal output, the first transistor being coupled to the power supply with the first transistor output providing digital signals of a particular voltage level in accordance with the voltage level supplied by the power supply to the first transistor;
    latch means for latching the first transistor off when the second transistor is on to reduce the direct current dissipation of power through the transistors; and
    isolation means for coupling the second transistor output to the signal output when the second transistor is on and for preventing the second transistor from breaking down while the first transistor is on.

2. The circuit of claim 1 wherein the latch means comprises a third transistor having an input coupled to the signal output and an output coupled to the first transistor input to turn the first transistor off when the second transistor is on.

3. The circuit of claim 1 further comprising an inverter operably connected between the signal input and the input of the first and second transistors for inverting the input signals.

4. A digital level shifter circuit for use in circuits having a first power supply and a second power supply having a supply voltage higher than that of the first power supply, said shifter circuit comprising:
    an inverter coupled to the first power supply, said inverter comprising a pair of complementary series-coupled MOS transistors;
    first and second cross-coupled transistors coupled to the second power supply, the first transistor having an input coupled to the inverter input and the second transistor output, and the second transistor having an input coupled to the inverter output so that the second transistor can turn off the first transistor as a function of the state of the inverter output; and
    isolation transistor means for coupling an inverter transistor in series with the first transistor, and for preventing the first transistor output voltage from breaking down said inverter transistor when the first transistor is on.

5. The circuit of claim 4 further comprising a second inverter having an output operably connected to the input of the first inverter.

6. The circuit of claim 5 wherein the second inverter comprises a complementary pair of MOS transistors.

7. The circuit of claim 6 further comprising second isolation transistor means for coupling the output of the second inverter to the first transistor input and for preventing the output voltage of the second transistor from breaking down a transistor of the second inverter when the second transistor is on.

8. A digital level shifter circuit for use in circuits having a first power supply and a second power supply having a supply voltage higher than that of the first power supply, said shifter comprising:
    a signal input;
    a first inverter having series-coupled n-channel and p-channel MOS transistors operably connected to the first power supply and having an input operably connected to the signal input;
    a second inverter having series-coupled n-channel and p-channel MOS transistors operably connected to the first power supply, and having an input operably connected to the output of the first inverter;
    first and second cross-coupled MOS transistors, the gate of the first cross-coupled transistor being operably connected to the drain of the second cross-coupled transistor, the drain of the first cross-coupled transistor being operably connected to the gate of the second transistor and the sources of the cross-coupled transistors being operably connected to the second power supply;
    a first isolation transistor means for coupling a transistor of the second inverter in series with the first cross-coupled transistor and for protecting said second inverter transistor from breaking down while the first cross-coupled transistor is on;
    a second isolation transistor means for coupling a transistor of the first inverter in series with the second cross-coupled transistor and for protecting said first inverter transistor from breaking down while said second cross-coupled transistor is on; and
    a signal output operably connected to the drain of the first cross-coupled transistor.

* * * * *